United States Patent
Morita

(10) Patent No.: US 9,773,315 B2
(45) Date of Patent: Sep. 26, 2017

(54) DEVICE AND METHOD FOR COMPUTING AMOUNT OF DRIFT AND CHARGED PARTICLE BEAM SYSTEM

(71) Applicant: JEOL Ltd., Tokyo (JP)

(72) Inventor: Masaki Morita, Tokyo (JP)

(73) Assignee: JEOL Ltd., Tokyo (JP)

( * ) Notice: Subject to any disclaimer, the term of this patent is extended or adjusted under 35 U.S.C. 154(b) by 131 days.

(21) Appl. No.: 14/696,886

(22) Filed: Apr. 27, 2015

(65) Prior Publication Data

US 2016/0019696 A1     Jan. 21, 2016

(30) Foreign Application Priority Data

Apr. 30, 2014  (JP) .................................. 2014-93429

(51) Int. Cl.
| | | |
|---|---|---|
| G06T 7/00 | (2017.01) | |
| H01J 37/244 | (2006.01) | |
| H01J 37/22 | (2006.01) | |
| H01J 37/28 | (2006.01) | |
| G06T 7/32 | (2017.01) | |
| G06T 7/73 | (2017.01) | |

(52) U.S. Cl.
CPC .............. G06T 7/0042 (2013.01); G06T 7/32 (2017.01); G06T 7/73 (2017.01); G06T 7/97 (2017.01); H01J 37/222 (2013.01); H01J 37/244 (2013.01); H01J 37/28 (2013.01); G06T 2207/10004 (2013.01); G06T 2207/10061 (2013.01); H01J 2237/221 (2013.01); H01J 2237/223 (2013.01); H01J 2237/24592 (2013.01); H01J 2237/26 (2013.01); H01J 2237/2617 (2013.01); H01J 2237/2802 (2013.01); H01J 2237/2809 (2013.01)

(58) Field of Classification Search
CPC ......... G06T 2207/10004; G06T 7/0026; H01J 2237/221; H01J 2237/223; H01J 2237/2617; H01J 2237/2809
See application file for complete search history.

(56) References Cited

U.S. PATENT DOCUMENTS

| | | | | |
|---|---|---|---|---|
| 5,677,536 A | * | 10/1997 | Vickers ................. | G01T 1/1642 250/252.1 |
| 5,818,383 A | * | 10/1998 | Stockburger .............. | G01S 3/46 342/109 |

(Continued)

FOREIGN PATENT DOCUMENTS

JP        2013165003 A     8/2013

*Primary Examiner* — Reza Aghevli
(74) *Attorney, Agent, or Firm* — The Webb Law Firm

(57) ABSTRACT

A drift amount computing device (100) computes an amount of drift between a first image and a second image, and comprises a correlation function computing section (112) for calculating a correlation function between the first and second images, a local maximum position searching section (114) for searching a range of positions of the correlation function for local maximum positions, a local maximum position determining section (116) for assigning weights to intensities of plural local maximum positions according to the distance from the center of the correlation function, comparing the weighted intensities of the local maximum positions, and determining one of the maximum local positions which corresponds to the amount of drift, and a drift amount computing section (118).

9 Claims, 10 Drawing Sheets

(56) References Cited

U.S. PATENT DOCUMENTS

| | | | | |
|---|---|---|---|---|
| 6,570,156 B1* | 5/2003 | Tsuneta | .................. | H01J 37/26 250/311 |
| 2007/0029478 A1* | 2/2007 | Sato | ......................... | G06T 5/50 250/310 |
| 2012/0287258 A1* | 11/2012 | Tsuneta | ................ | H01J 37/265 348/80 |
| 2013/0254948 A1* | 9/2013 | Hartong | ................. | H01J 37/28 850/1 |
| 2014/0326869 A1* | 11/2014 | Knochenmuss | ..... | G01N 27/622 250/282 |
| 2015/0002652 A1* | 1/2015 | Takasugi | ................ | G01B 15/00 348/80 |
| 2015/0036888 A1* | 2/2015 | Weisenburger | ........... | G06T 7/20 382/107 |
| 2015/0211974 A1* | 7/2015 | Knochenmuss | ........ | H01J 49/40 250/282 |
| 2015/0324989 A1* | 11/2015 | Smith | .................. | G06T 7/0026 382/278 |

* cited by examiner

| Order | X | Y | Intensity of cross-correlation function (Relative value) |
|---|---|---|---|
| 1 | −3 | −5 | 1 |
| 2 | 4 | −5 | 0.999622151 |
| 3 | −3 | −12 | 0.966991113 |
| 4 | −3 | 2 | 0.966114503 |
| 5 | 4 | −12 | 0.952149205 |
| 6 | 0 | −2 | 0.95193761 |
| 7 | −3 | 8 | 0.950940088 |
| 8 | −6 | 5 | 0.947751043 |

Fig.10

| Order | X | Y | Intensity of cross-correlation function (Relative value) |
|---|---|---|---|
| 1 | 27 | 0 | 1 |
| 2 | -20 | -8 | 0.816475 |
| 3 | -11 | -55 | 0.548833 |

DEVICE AND METHOD FOR COMPUTING AMOUNT OF DRIFT AND CHARGED PARTICLE BEAM SYSTEM

BACKGROUND OF THE INVENTION

Field of the Invention

The present invention relates to device and method for calculating an amount of drift. The invention also relates to a charged particle beam system.

Description of Related Art

In a scanning electron microscope (SEM), a scanning transmission electron microscope (STEM), or other similar instrument, if a drift of a sample occurs, then a second scan results in an image of an observed subject deviating from an image of the subject produced by a first scan.

This drift of the sample is corrected, for example, by preparing a reference image providing a reference, creating an image of interest (image to be compared) that has drifted during an observation or analysis, calculating a cross-correlation function or a phase-only correlation function from the reference image and from the compared image, computing the amount of deviation (amount of drift) of the compared image from the reference image, and feeding the computed amount back to the apparatus. The amount of drift corresponds to a relative position between the position where the cross-correlation function or phase-only correlation function produces a maximum intensity and the center of the function.

FIG. 13 is a flowchart illustrating one example of a general process for correcting drifts. This process includes step S10 for obtaining a reference image, step S12 for performing an observation or an analysis, step S14 for obtaining an image to be compared against the reference image, step S16 for computing an amount of drift, and step S18 for correcting the amount of drift by feeding information about the computed amount of drift to an electron microscope. If the decision at step S12 is negative (No), indicating that neither an observation nor an analysis is performed, then the process is ended.

FIG. 14 is a flowchart illustrating one example of the step S16, i.e., a general process for computing an amount of drift. This process includes step S162 for taking Fourier transforms of a reference image and an image to be compared, step S164 for calculating a cross-correlation function between the reference image and the compared image, and step S166 for searching for a position at which the cross-correlation function shows a maximum intensity.

Where an image of the subject of observation or analysis shows a periodic structure such as an atomic arrangement, it is difficult to judge, using the cross-correlation function, whether the amount of the deviation of the compared image from the reference image is one period of the periodic structure or exceeds one period. Where the actual drift is less than one period, the amount of drift may be calculated to be greater than one period using the cross-correlation function, for example, due to image blurring or by the effects of noise.

FIG. 15 schematically shows an image D in which a reference image containing a periodic structure and a compared image containing a periodic structure are superimposed. In FIG. 15, small circles with leftwardly and downwardly drawn hatching lines indicate particles of the reference image. Small circles with rightwardly and downwardly drawn hatch lines indicate particles of the compared image. In the overlapped image D shown in FIG. 15, there is no drift between the reference image and the compared image. However, the reference image and the compared image suffer from image blurring, and the period deviates in some locations.

FIG. 16 shows one example of a cross-correlation function between a reference image having blurred portions and a compared image having blurred portions. An indicia "x" shown in FIG. 16 indicates a position where a maximum intensity occurs. In FIG. 16, no drift occurs between the reference image and the compared image.

Where neither the reference image nor the compared image is blurred, the amount of drift is zero, and the center of the cross-correlation function exhibits a maximum intensity. However, where the reference image and the compared image suffer from image blurring, the position at which the cross-correlation function shows a maximum intensity deviates from the center although there is no drift as shown in FIG. 16. For example, in the example shown in FIG. 16, the position at which a maximum intensity occurs deviates one period from the center in the X-axis direction although there is no drift between the reference image and the compared image. In this case, the cross-correlation function suffers from a deviation of one period by the effects of image blurring in spite of the fact that there is no drift. Consequently, the drift is overcorrected.

In view of this problem, JP-A-2013-165003 proposes a solution. That is, if a pattern contained in plural image signals is judged to have periodicity when a matching process is performed between the image signals, the image signal region to be processed is narrowed down to a region where two or more patterns of identical geometry are not contained. Consequently, even if an image including a repetitive pattern is obtained, an appropriate accumulation signal can be formed.

SUMMARY OF THE INVENTION

One object associated with some aspects of the present invention is to provide a device and method capable of computing an amount of drift accurately. Another object associated with some aspects of the invention is to provide a charged particle beam system including this device for computing an amount of drift.

(1) A device for computing an amount of drift in accordance with the present invention is adapted to compute an amount of drift between a first image and a second image. The device has: a correlation function computing section for calculating a correlation function between the first and second images; a local maximum position searching section for searching a range of positions of the correlation function for local maximum positions at which the correlation function assumes its local maxima; a local maximum position determining section for assigning weights to intensities of the local maximum positions searched for by the local maximum position searching section according to the distance from the center of the correlation function, comparing the weighted intensities, and determining one of the local maximum positions which corresponds to the amount of drift; and a drift amount computing section for computing the amount of drift, based on the local maximum position corresponding to the amount of drift.

In this drift amount computing device, the possibility that the amount of drift will be overcalculated can be reduced for an image which contains a periodic structure and which is affected by image blurring or noise. Therefore, this device can precisely calculate the amount of drift even if the image contains a periodic structure.

This drift amount computing device can calculate an amount of drift for an image containing no periodic structure in the same way as for an image containing a periodic structure. Consequently, this drift amount computing device can calculate amounts of drifts irrespective of whether there is periodicity.

(2) In one feature of this drift amount computing device, the plural local maximum positions searched for by the local maximum position searching section are two in number and include a first local maximum position and a second local maximum position which have intensities A and B, respectively. The local maximum position determining section may take the first local maximum position as a candidate which is selected from the local maximum positions and which corresponds to the amount of drift if the distance between the first local maximum position and the center is greater than the distance between the second local maximum position and the center, and, at the same time, a relationship given by $B \times \alpha < A$ (where $\alpha > 1$) is satisfied. The local maximum position determining section may take the first local maximum position as a candidate which is selected from the local maximum position and which corresponds to the amount of drift if the distance between the first local maximum position and the center is smaller than the distance between the second local maximum position and the center and, at the same time, a relationship given by $B < A \times \alpha$ is satisfied.

In this drift amount computing device, in comparing the intensities of two local maximum positions, weights may be assigned to the intensities of the local maximum positions according to the distance from the center of the correlation function by multiplying the intensity of the local maximum position at a short distance from the center of the cross-correlation function by a coefficient $\alpha$, and the weighted intensities are compared. Accordingly, if the image contains a periodic structure, the possibility that the amount of drift will be overcalculated can be reduced.

(3) In a further feature of this drift amount computing device, the correlation function may be a cross-correlation function or a phase-only correlation function.

(4) In an additional feature of this drift amount computing device, the local maximum position searching section may search for the local maximum positions in turn first from the position least distant from the center of the correlation function. The local maximum position determining section may assign weights to the intensities of the local maximum positions in turn in the order in which the local maximum positions were searched for by the local maximum position searching section according to the distance from the center and compare the weighted intensities.

In this drift amount computing device, information about the local maximum positions is input to the local maximum position determining section in turn first from the position least distant from the center of the correlation function and, therefore, the local maximum positions can be easily compared in terms of the distance from the center of the correlation function. Hence, the process can be simplified.

(5) In a still other feature of this drift amount computing device, the local maximum position determining section may assign weights to the intensities according to the distance from the center by multiplying the correlation function by a window function.

In this drift amount computing device, the intensities of the local maximum positions can be compared by assigning weights to the intensities according to the distance from the center of the correlation function using a window function. Accordingly, if the image contains a periodic structure, the possibility that the amount of drift will be overcalculated can be reduced.

(6) In a yet other feature of this drift amount computing device, there may be further provided a drift correction amount computing section for calculating an amount of drift correction by which to correct the drift between the first and second images, based on the amount of drift.

In this drift amount computing device, a drift correction can be easily made.

(7) A method of computing an amount of drift in accordance with the present invention; is adapted to compute an amount of drift between a first image and a second image. The method starts with calculating a correlation function between the first and second images. Then, a range of positions of the correlation function is searched for local maximum positions at which the correlation function assumes its local maxima. Weights are assigned to intensities of the local maximum positions searched for by the step of searching according to the distance from the center of the correlation function, and the weighted intensities are compared. One of the local maximum positions which corresponds to the amount of drift is determined. The amount of drift is computed, based on the local maximum position corresponding to the amount of drift.

In this method of computing an amount of drift, if the image contains a periodic structure and is affected by image blurring or noises, the possibility that the amount of drift will be overcalculated can be reduced. Therefore, in this method of computing an amount of drift, if the image contains a periodic structure, the amount of drift can be calculated precisely.

Furthermore, in this method of computing an amount of drift, if the image contains no periodic structure, the amount of drift can be calculated in the same way as for an image containing a periodic structure. Consequently, according to this method of computing an amount of drift, amounts of drifts can be found easily irrespective of whether there is periodicity.

(8) In one feature of this method of computing an amount of drift, the plural local maximum positions searched for by the step of searching are two in number and include a first local maximum position and a second local maximum position which have intensities A and B, respectively. During the step of determining a local maximum position, if the distance between the first local maximum position and the center is greater than the distance between the second local maximum position and the center and, at the same time, a relationship given by $B \times \alpha < A$ (where $\alpha > 1$) is satisfied, then the first local maximum position may be taken as a candidate which is selected from the local maximum positions and which corresponds to the amount of drift. If the distance between the first local maximum position and the center is smaller than the distance between the second local maximum position and the center and, at the same time, a relationship given by $B < A \times \alpha$ is satisfied, then the first local maximum position may be determined as a candidate which is selected from the local maximum positions and which corresponds to the amount of drift.

In this method of computing a drift amount, in comparing the intensities of the two local maximum positions, weights may be assigned to the intensities according to the distance from the center of the correlation function by multiplying the intensity of the local maximum position at a short distance from the center of the correlation function by a coefficient $\alpha$. Accordingly, if the image contains a periodic structure, the possibility that the amount of drift will be overcalculated can be reduced.

(9) In a further feature of this method of computing an amount of drift, the correlation function may be a cross-correlation function or a phase-only correlation function.

(10) In one feature of the method of computing an amount of drift as set forth in the paragraph (7) above, during the step of searching, the local maximum positions may be searched for in turn first from the position least distant from the center of the correlation function. During the step of determining a local maximum position, weights may be assigned in turn to the intensities of the local maximum positions according to the distance from the center in the order in which the local maximum positions were searched for during the step of searching, and the weighted intensities of the local maximum positions may be compared.

In this method of computing an amount of drift, during the step of determining a local maximum position, information about local maximum positions can be obtained in turn first from the local maximum position least distant from the center of the correlation function and, therefore, the local maximum positions can be easily compared in terms of the distance from the center of the correlation function. Hence, the process can be simplified.

(11) In another feature of the method of computing an amount of drift as set forth in the paragraph (7) above, during the step of determining a local maximum position, weights may be assigned according to the distance from the center by multiplying the correlation function by a window function.

In this method of computing an amount of drift, weights can be assigned to the intensities of the local maximum positions according to the distance from the center of the correlation function using a window function, and the weighted intensities can be compared. Therefore, if the image contains a periodic structure, the possibility that the amount of drift will be overcalculated can be reduced.

(12) In a further feature of the method of computing an amount of drift as set forth in the paragraph (7) above, there may be further provided the step of calculating an amount of drift correction by which to correct the drift between the first and second images, based on the amount of drift.

In this method of computing an amount of drift, a drift correction can be easily made.

(13) A charged particle beam system associated with the present invention includes a drift amount computing device associated with the present invention.

This charged particle beam system can include a drift amount computing device capable of calculating amounts of drifts precisely. In consequence, this charged particle beam system can correct drifts precisely.

BRIEF DESCRIPTION OF THE DRAWINGS

FIG. 10 is a table listing local maximum positions of the cross-correlation function shown in FIG. 9.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Drift Amount Computing Device

Figure 1:
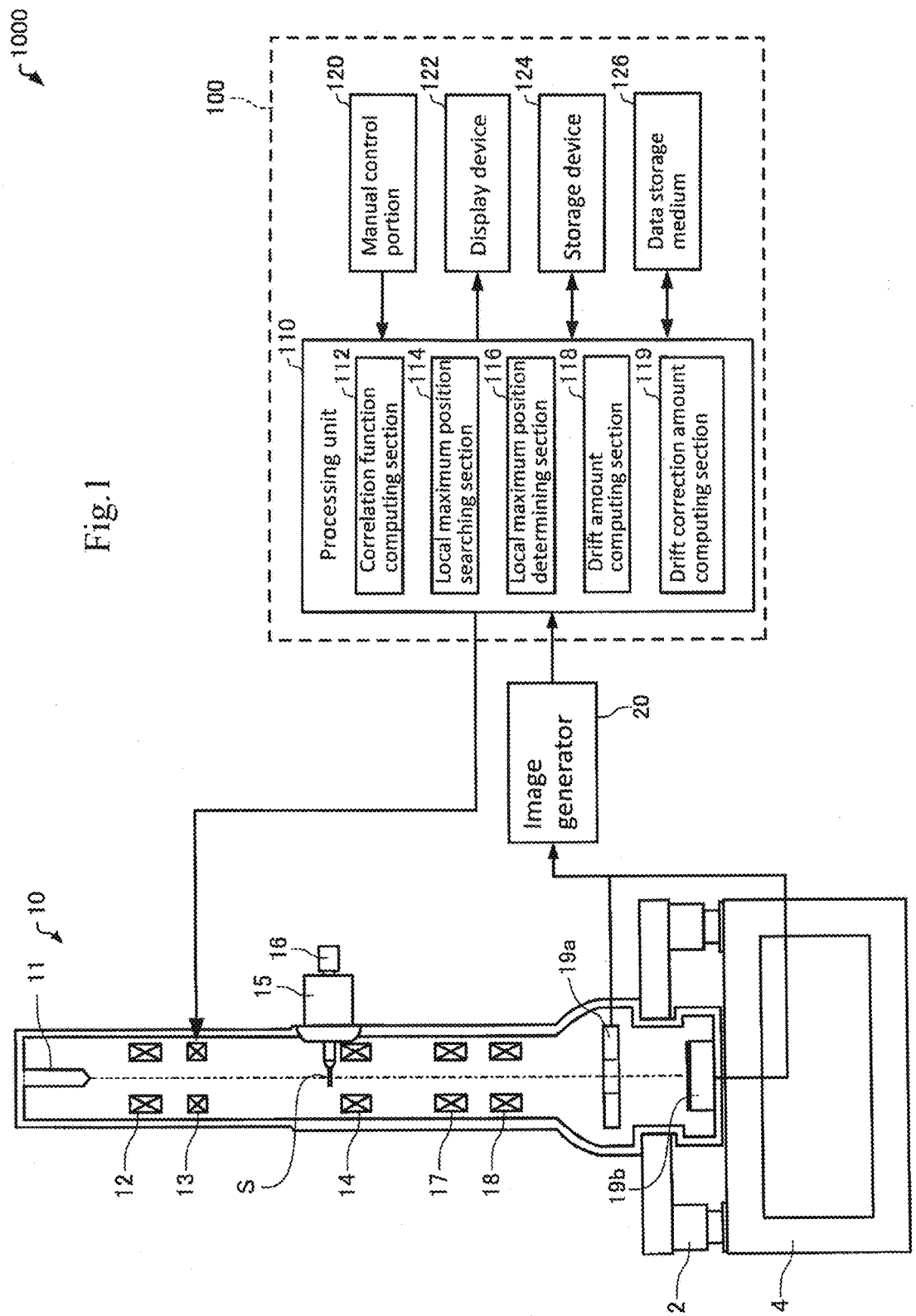
FIG. 1 is a schematic block diagram of a charged particle beam system including a drift amount computing device associated with one embodiment of the present invention.

A drift amount computing device associated with one embodiment of the present invention is first described by referring to FIG. 1, which schematically shows the configuration of a charged particle beam system, 1000, including the drift amount computing device, 100.

The charged particle beam system 1000 includes a system body 10 and an image generator 20 in addition to the drift amount computing device 100. In the illustrated example, the charged particle beam system 1000 is a scanning transmission electron microscope (STEM) which is an instrument for scanning an electron probe over a sample S and detecting electrons transmitted through the sample S to obtain a scanned image.

The system body 10 of the charged particle beam system has an electron beam source 11, a condenser lens system 12, a scanner 13, an objective lens 14, a sample stage 15, a sample holder 16, an intermediate lens 17, a projector lens 18, and detectors 19a, 19b.

The electron beam source 11 produces an electron beam by accelerating electrons by means of an anode after the electrons are emitted by a cathode. An electron gun can be used as the electron beam source 11. No restrictions are imposed on the electron gun used as the electron beam source 11. For example, a thermionic electron gun, a thermal field-emission electron gun, a cold field emission gun, or other electron gun can be used.

The condenser lens system 12 is located behind (on the downstream side relative to the direction of the electron beam) the electron beam source 11 and used to focus the electron beam produced by the electron beam source 11. The condenser lens system 12 may be configured including plural lenses such as condenser lenses and condenser minilenses (not shown).

The scanner 13 is located behind the condenser lens system 12 and used to deflect the electron beam to scan the beam (electron probe) focused by the condenser lens system 12 and objective lens 14 over the sample S in response to a scan signal generated by a scan signal generator (not shown). The scanner 13 has scan coils for deflecting the beam. The objective lens 14 is disposed behind the scanner 13 including the scan coils, and is used to focus the electron beam onto the sample S.

The sample stage 15 holds the sample S. In the illustrated example, the sample stage 15 holds the sample S via the sample holder 16. For example, the sample stage 15 places the sample S between the upper and lower polepieces of the objective lens 14. The sample stage 15 can place the sample S in position by moving and stopping the sample holder 16. The sample stage 15 can move the sample S in a horizontal direction perpendicular to the direction of travel of the electron beam and also in a vertical direction along the direction of travel of the beam. Furthermore, the sample stage 15 can tilt the sample S.

In the illustrated example, the sample stage 15 is a side-entry stage for inserting the sample S from a side of the polepieces (not shown) of the objective lens 14. Alternatively, the sample stage 15 may be a top-loading stage for inserting the sample S from above the polepieces of the objective lens 14.

The intermediate lens 17 is located behind the objective lens 14. The projector lens 18 is disposed behind the intermediate lens 17. The intermediate lens 17 and projector lens 18 guide the electron beam transmitted through the sample S to the detectors 19a and 19b. For example, the intermediate lens 17 and projector lens 18 project and focus the image plane or back focal plane of the objective lens 14, at which a diffraction pattern is formed, onto the detectors 19a and 19b.

The dark field image detector 19a is located behind the projector lens 18. No restriction is placed on the position of the detector 19a as long as it is positioned behind the sample S. The dark field image detector 19a is used to detect a dark field image. The dark field image detector 19a is an annular detector, for example, and detects electrons scattered at high angles by the sample S. Electrons transmitted without being scattered, by the sample S and electrons scattered at low angles by the sample S pass through the dark field image detector 19a without being detected by this detector 19a.

The bright field image detector 19b is located behind the dark field image detector 19a and detects electrons transmitted through the dark field image detector 19a. In the illustrated example, the system body 10 of the charged particle beam system is mounted on a pedestal 4 via vibration isolators 2.

The image generator 20 operates to image detection signals from the detectors 19a and 19b which indicate the intensity of the electron signal in synchronism with the scan signal. As a result, an STEM image is generated, the STEM image representing a distribution of the intensities of the electron beam corresponding to sample positions. The distribution is obtained by synchronizing the detection signals and the scan signal. The image generator 20 can generate a HAADF (high-angle annular dark-field imaging)-STEM image from the detection signal from the dark field image detector 19a and output information about the generated HAADF-STEM image to the drift amount computing device 100.

The image generator 20 may operate as a computer by causing a control program stored in a storage device (not shown) to be executed by a CPU (central processing unit), and may perform the above-described processing. At least a part of the image generator 20 may be realized by hardware (dedicated circuitry) and perform the above-described processing.

The drift amount computing device 100 is used to calculate the amount of drift between two images. An amount of drift is a vector quantity and has a magnitude and a direction. It can be said that an amount of drift is an amount of positional deviation between two images. For instance, the drift amount computing device 100 operates to calculate an amount of drift between a reference image (herein also referred to as the first image) generated by the image generator 20 based on the image data captured by the system body 10 and a compared image (herein also referred to as the second image) generated by the image generator 20 after a lapse of a given time since capturing of the reference image. The drift amount computing device 100 includes a processing unit 110, a manual control portion 120, a display device 122, a storage device 124, and a data storage medium 126.

The manual control portion 120 operates to obtain a manual control signal responsive to a user's manipulation or action and to send the signal to the processing unit 110. For example, the manual control portion 120 is made of buttons, keys, a touch panel display, a microphone, or the like.

The display device 122 provides a display of the image generated by the processing unit 110. The function of the display device 122 can be implemented by an LCD, CRT, or the like. The display device 122 can display information about an amount of drift calculated by the processing unit 110 and information about an amount of drift correction. Furthermore, the display device 122 can display an image (such as an STEM image or HAADF-STEM image) generated, for example, by the image generator 20.

The storage device 124 acts as a working area for the processing unit 110. The function of the storage device 124 can be implemented by a RAM or the like. The storage device 124 stores computer programs, data, and other information permitting the processing unit 110 to perform various computational operations and control operations. The results of calculations executed by the processing unit 110 according to various programs are temporarily stored also in the storage device 124.

The data storage medium 126 is a computer-readable medium and stores programs, data, and related information. The function of the storage medium 126 can be implemented by an optical disc (such as a CD or DVD), a magnetooptical disc (MO), magnetic disc, hard disc, magnetic tape, or memory (such as a ROM). The processing unit 110 performs various kinds of processing of the present embodiment based on programs and data stored in the data storage medium 126. The storage medium 126 can store computer programs for causing a computer to act as various parts of the processing unit 110.

The processing unit 110 performs various computational operations in accordance with computer programs stored in the storage device 124. The processing unit 110 operates as a correlation function computing section 112, a local maximum position searching section 114, a local maximum position determining section 116, a drift amount computing section 118, and a drift correction amount computing section 119 which are described below by executing programs stored in the storage device 124. The functions of the processing unit 110 can be implemented by hardware such as various processors (e.g., a CPU or DSP), an ASIC (such as a gate array), or computer programs. At least a part of the processing unit 110 may be implemented by hardware such as dedicated circuitry. The processing unit 110 includes the correlation function computing section 112, local maximum position searching section 114, local maximum position determining section 116, drift amount computing section 118, and drift correction amount computing section 119.

The correlation function computing section 112 calculates a correlation function between a reference image and an image to be compared. A cross-correlation function or a phase-only correlation function can be used as the correlation function. In the example provided below, a cross-correlation function is used as a correlation function.

Figure 2:
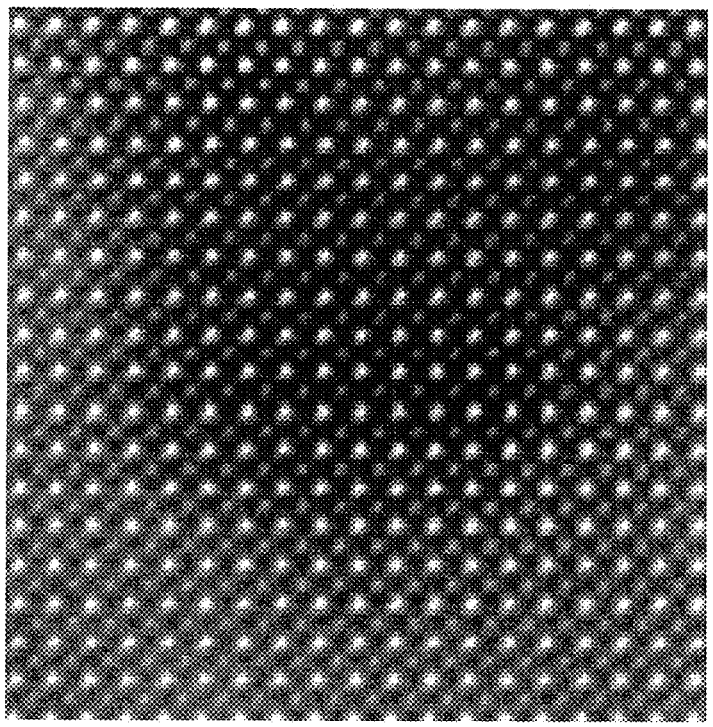
FIG. 2 is a photograph of one example of reference image.
Figure 3:
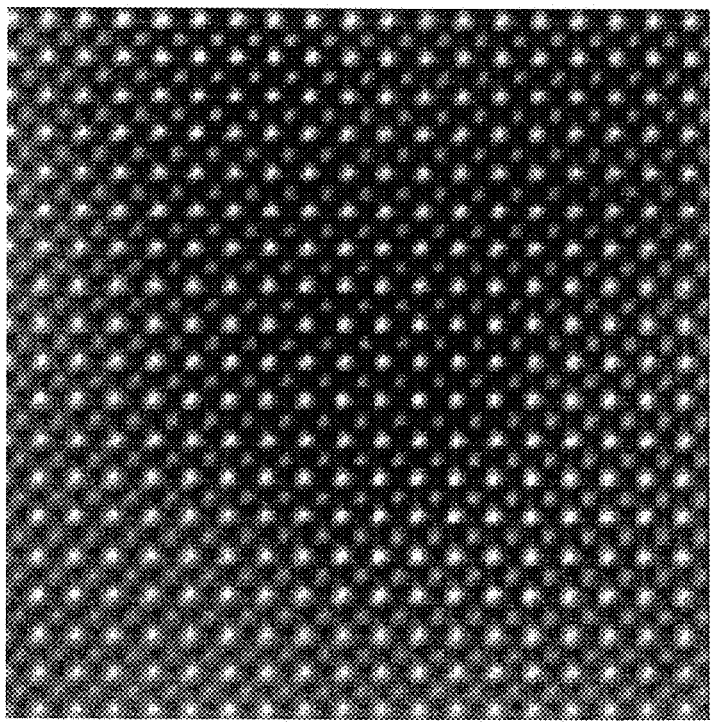
FIG. 3 is a photograph of one example of image to be compared.

FIG. 2 is a photograph showing one example of the reference image. FIG. 3 is a photograph showing one example of the compared image. The reference image shown in FIG. 2 and the compared image shown in FIG. 3 are STEM-HAADF images taken consecutively. The correlation function computing section 112 first takes Fourier transforms of the reference image and compared image and calculates a cross-correlation function from the Fourier transformed reference and compared images.

Figure 4:
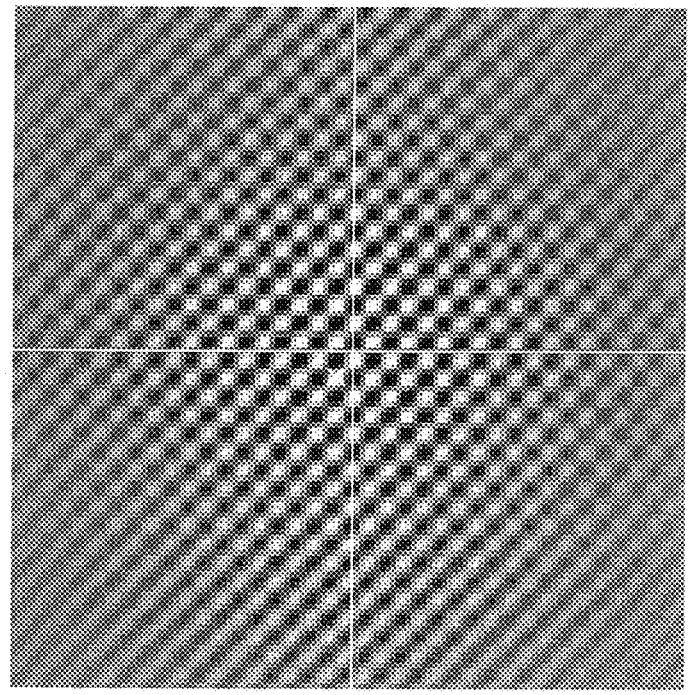
FIG. 4 is a diagram illustrating one example of a cross-correlation function of a reference image and an image to be compared.

FIG. 4 shows one example of the cross-correlation function of the reference image and the compared image. Two straight lines which intersect with each other perpendicularly as shown in FIG. 4 are central lines. FIG. 4 shows a cross-correlation function between the reference image shown in FIG. 2 and the compared image shown in FIG. 3.

The local maximum position searching section 114 searches a range of positions of the cross-correlation found by the correlation function computing section 112 for local maximum positions at which the cross-correlation function assumes its local maxima. For example, if the intensity of a position of interest assumed by a cross-correlation function is greater than the intensities of adjacent positions, the local maximum position searching section 114 takes the position of interest as a local maximum position and outputs information indicating the coordinates of the local maximum position and the intensity (local maximum value) to the local maximum position determining section 116.

The local maximum position searching section 114 searches all the values of the cross-correlation function shown in FIG. 4 from the left top end of FIG. 4 to the right bottom end in turn for local maxima. No restriction is imposed on the order in which the local maximum position searching section 114 searches for local maximum positions of the cross-correlation function. If a local maximum position is detected, the local maximum position searching section 114 outputs information indicating the intensity (local maximum value) of the local maximum position and the coordinates of the local maximum position searched for to the local maximum position determining section 116.

The local maximum position determining section 116 assigns weights to the intensities of plural local maximum positions searched for by the local maximum position searching section 114 according to the distance from the center of the correlation function, compares the weighted intensities, and determines a maximum local position corresponding to the amount of drift.

If information about the intensities of two local maximum positions (referred to as the first and second local maximum positions) searched for by the local maximum position searching section 114 is obtained, the local maximum position determining section 116 calculates the distance between the first local maximum position and the center of the cross-correlation function and the distance between the second local maximum position and the center of the cross-correlation function. The local maximum position determining section 116 assigns weights to the intensity of the first local maximum position and to the intensity of the second local maximum position according to the distance from the center of the correlation function, compares the weighted intensities, and takes one of the two local maximum positions as a candidate of local maximum position corresponding to the amount of drift based on the results of the comparison.

Figure 5:
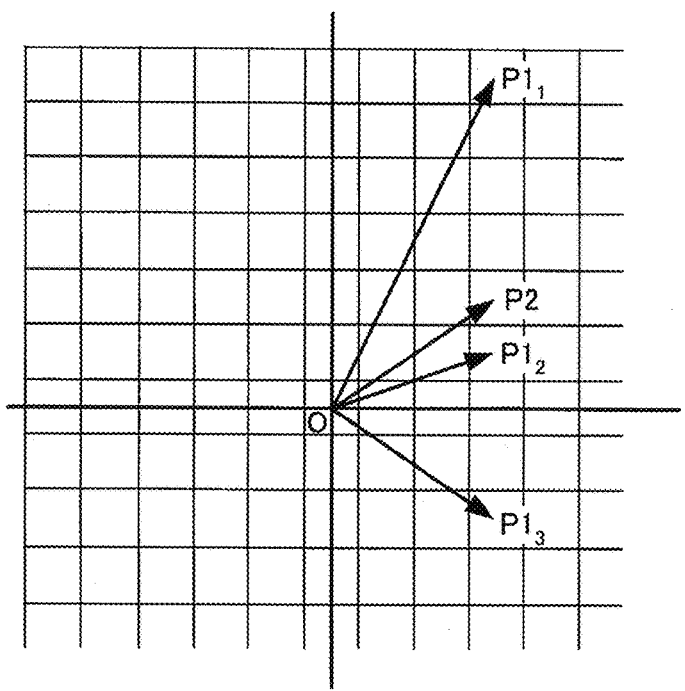
FIG. 5 is a diagram illustrating one example of operation for assigning weights to the intensities of two local maximum positions according to the distance from the center of a cross-correlation function and comparing the weighted intensities.

FIG. 5 illustrates one example of an operation of the local maximum position determining section 116 for assigning weights to the intensities of two local maximum positions (first local maximum positions $P1_1$, $P1_2$, and $P1_3$, and a second local maximum position P2) according to the distance from the center O of the cross-correlation function and comparing the weighted intensities of the two local maximum positions.

A case where the intensity A of the first local maximum position $P1_1$ and the intensity B of the second local maximum position P2 are compared is first described. As can be seen from FIG. 5, the distance between the first local maximum position $P1_1$ and the center O is greater than the distance between the second local maximum position P2 and the center O.

If the distance between the first local maximum position $P1_1$ and the center O is greater than the distance between the second local maximum position P2 and the center O and, at the same time, a relationship given by $B \times \alpha < A$ (where $\alpha > 1$) is satisfied, the local maximum position determining section 116 takes the first local maximum position $P1_1$ as a candidate of local maximum position corresponding to the amount of drift. If the relationship, $B \times \beta < A$, does not hold, the local maximum position determining section 116 takes the second local maximum position P2 as a candidate of local maximum position corresponding to the amount of drift.

The coefficient $\alpha$ is a fixed value greater than 1. For example, the coefficient $\alpha = 1.1$. No restriction is imposed on the value of the coefficient $\alpha$ as long as it is greater than unity. The value of the coefficient $\alpha$ can be varied at will.

A case in which the intensity A of the first local maximum position $P1_2$ and the intensity B of the second local maximum value P2 are compared is next described. As can be seen from FIG. 5, the distance between the first local maximum position $P1_2$ and the center O is smaller than the distance between the second local maximum position P2 and the center O.

If the distance between the first local maximum position $P1_2$ and the center O is smaller than the distance between the second local maximum position P2 and the center O and, at the same time, the relationship, $B < A \times \alpha$, is satisfied, then the local maximum position determining section 116 takes the first local maximum position $P1_2$ as a candidate of local maximum position corresponding to the amount of drift. If the relationship, $B < A \times \alpha$, does not hold, the local maximum position determining section 116 takes the second local maximum position P2 as a candidate of local maximum position corresponding to the amount of drift.

A case in which the intensity A of the first local maximum position $P1_3$ and the intensity B of the second local maximum position P2 are compared is next described. As shown in FIG. 5, the distance between the first local maximum position P1₃ and the center O is equal to the distance between the second local maximum position P2 and the center O.

If the distance between the first local maximum position P1₃ and the center O is equal to the distance between the second local maximum position P2 and the center O and, at the same time a relationship given by B<A is satisfied, the local maximum position determining section 116 takes the first local maximum position P1₃ as a candidate of local maximum position corresponding to the amount of drift. If the relationship, B<A, does not hold, the local maximum position determining section 116 takes the second local maximum position P2 as a candidate of local maximum position corresponding to the amount of drift.

In this way, the local maximum position determining section 116 assigns weights to the intensities of local maximum positions according to the distance from the center O of the cross-correlation function, compares the weighted intensities, and takes one (such as the first local maximum position) of the two local maximum positions as a candidate of local maximum position corresponding to the amount of drift based on the results of the comparison. The determining section 116 then stores information (i.e., its intensity (maximum value) and coordinates) about the candidate of local maximum position corresponding to the amount of drift in the storage device 124.

Whenever a local maximum position is searched for by the local maximum position searching section 114, the local maximum position determining section 116 assigns weights to the intensity of the local maximum position just searched for and to the intensity of the candidate of local maximum position stored in the storage device 124 and corresponding to the amount of drift according to the distance from the center O of the cross-correlation function as described previously and compares the weighted intensities. If the intensity of the local maximum position searched for becomes a candidate of local maximum position corresponding to the amount of drift, the local maximum position determining section 116 updates the information about the candidate of local maximum position corresponding to the amount of drift and stored in the storage device 124.

Whenever a local maximum position is searched for by the local maximum position searching section 114, the local maximum position determining section 116 performs the above-described operation. All the local maximum positions searched for by the local maximum position searching section 114 are processed as described above. A candidate of local maximum position corresponding to the amount of drift finally remaining in the storage device 124 is determined as a local maximum position corresponding to the amount of drift.

The drift amount computing section 118 calculates an amount of drift (i.e., an amount of positional deviation) between the reference image and the compared image, based on the local maximum position corresponding to the amount of drift determined by the local maximum position determining section 116. The drift amount computing section 118 computes an amount of drift (the magnitude and direction of the drift) of the compared image from the reference image from a vector connecting together the local maximum position corresponding to the amount of drift and the center O of the cross-correlation function. Information about the amount of drift computed by the drift amount computing section 118 is output to the drift correction amount computing section 119.

The drift correction amount computing section 119 calculates an amount of drift correction by which to correct the drift of the second image from the first image, based on the amount of drift calculated by the drift amount computing section 118. An amount of drift correction referred to herein is a vector quantity which is equal in magnitude, but opposite in sense, to an amount of drift.

The processing unit 110 outputs information about the amount of drift correction found by the drift correction amount computing section 119 to the scanner 13. The scanner 13 modifies the region of the sample S to be scanned based on the information about the amount of drift correction and corrects the drift.

The processing unit 110 may output the information about the amount of drift correction to the electron beam deflector (not shown) of the system body 10 of the charged particle beam system. The electron beam deflector may deflect the electron beam based on the information about the amount of drift correction, modify the region of the sample S to be scanned, and correct the drift.

Furthermore, the processing unit 110 may provide control such that information about the amount of drift and information about the amount of drift correction is displayed on the display device 122. This permits a user to visually check the state of the drift of the sample S by seeing the information about the amount of drift and the information about the amount of drift correction displayed on the display device 122.

The drift amount computing device 100 and the charged particle beam system 1000 have the following features. In the drift amount computing device 100, the local maximum position searching section 114 searches a range of positions of the correlation function for local maximum positions at which the correlation function between the reference image and the compared image assumes its local maximum values. The local maximum position determining section 116 assigns weights to the intensities of the local maximum positions searched for by the local maximum position searching section 114 according to the distance from the center of the correlation function, compares the weighted intensities, and determines a local maximum position corresponding to the amount of drift. The drift amount computing section 118 calculates an amount of drift based on the local maximum position corresponding to the amount of drift. Therefore, even for an image containing a periodic structure and affected by image blurring and noises, the drift amount computing device 100 can reduce the possibility that the amount of drift will be overcalculated. Consequently, the drift amount computing device 100 can precisely compute an amount of drift even for an image containing a periodic structure.

For example, when an amount of drift between two images which contain a periodic structure and which suffer from image blurring or are affected by noises, if the intensities of local maximum values of a cross-correlation function are simply compared without assigning weights to the intensities, the greatest local maximum value is determined, and an amount of drift is calculated, then the amount of drift may be calculated to be longer than one period in practice using a cross-correlation function in spite of the fact that the amount of drift is shorter than one period. In contrast, in the drift amount computing device 100, the possibility that the amount of drift will be overcalculated can be reduced because a local maximum position corresponding to the amount of drift is determined after assigning weights to the intensities of local maximum positions (local maximum values) according to the distance from the center of the correlation function and comparing the weighted intensities.

Furthermore, the drift amount computing device 100 can calculate an amount of drift even for an image containing no periodic structure in the same way as for an image containing a periodic structure. Therefore, if a pattern is judged to have periodicity, the drift amount computing device 100 can calculate an amount of drift easily irrespective of whether there is periodicity without the need to judge on the periodicity, unlike the case where an image signal region is narrowed down to a region where two or more patterns of identical geometry are not contained and then an amount of drift is calculated.

In the drift amount computing device 100, let A be the intensity of a first one of two local maximum positions searched for by the local maximum position searching section 114. Let B be the intensity of a second one of the local maximum positions. If the distance between the first local maximum position and the center O of the correlation function is greater than the distance between the second local maximum position and the center O of the correlation function and, at the same time, the relationship given by B×α<A (where α>1) is satisfied, then the local maximum position determining section 116 determines the first local maximum position as a candidate of local maximum position corresponding to the amount of drift. If the distance between the first local maximum position and the center O of the correlation function is smaller than the distance between the second local maximum position and the center O of the correlation function and, at the same time, the relationship, B<A×α, holds, then the local maximum position determining section 116 determines the first local maximum position as a candidate of local maximum position corresponding to the amount of drift. Therefore, the drift amount computing device 100 can assign weights to the intensities of the local maximum positions according to the distance from the center of the correlation function and compare the weighted intensities. The device can reduce the possibility that an amount of drift will be overcalculated even for an image containing a periodic structure. Furthermore, the drift amount computing device 100 can compute an amount of drift even for an image containing no periodic structure in the same way as for an image containing a periodic structure, for the reason described below.

Figures 6, 7:
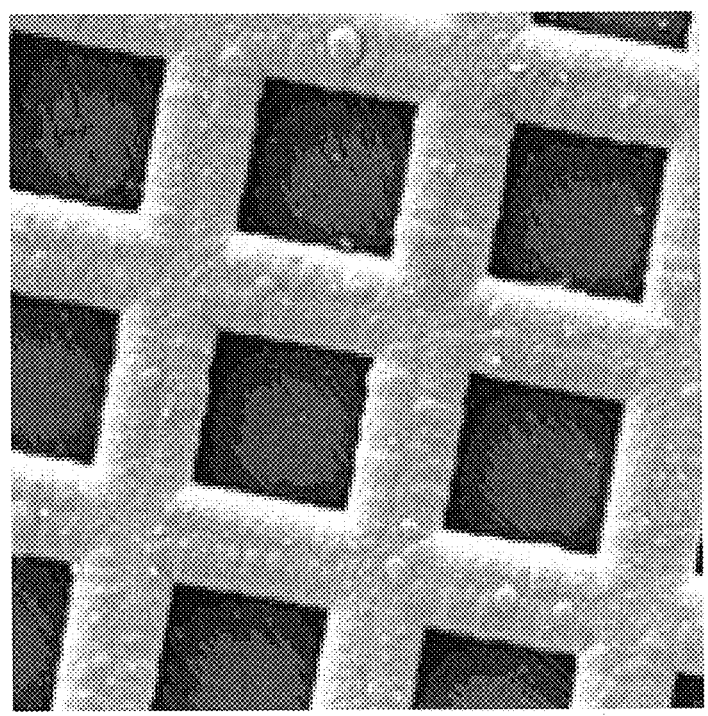
FIG. 6 is a table listing local maximum positions of a cross-correlation function.
FIG. 7 shows a reference image containing a periodic structure of low periodicity.

FIG. 6 is a table listing local maximum positions of the cross-correlation function shown in FIG. 4. In the table of FIG. 6, the local maximum values are arrayed in decreasing order. The cross-correlation function shown in FIG. 4 is a cross-correlation function between two images (the reference image shown in FIG. 2 and the compared image shown in FIG. 3) captured consecutively. A local maximum position corresponding to the amount of drift between the two images is a local maximum position (0, −2) (order 6; a local maximum value of 0.95193761) closest to the center of the cross-correlation function. However, because of image blurring and the effects of noises, there are five local maximum positions having intensities greater than the intensity of the local maximum position (0, −2) as shown in the table of FIG. 6. Accordingly, it can be seen that in the case of the cross-correlation function shown in FIG. 4, the local maximum values have varied by about 5% due to image blurring and the effects of noises.

Figure 8:
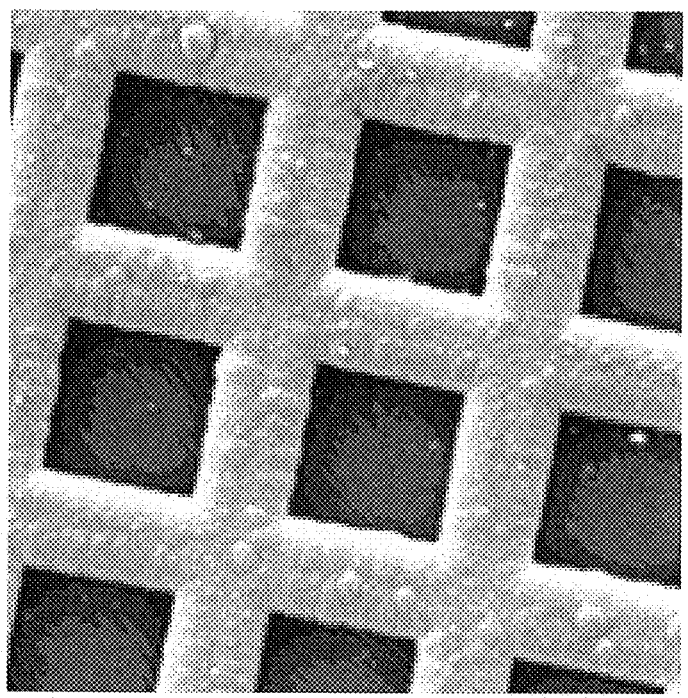
FIG. 8 shows a compared image obtained by laterally shifting the reference image shown in FIG. 7 by a distance of 27 pixels.
Figure 9:
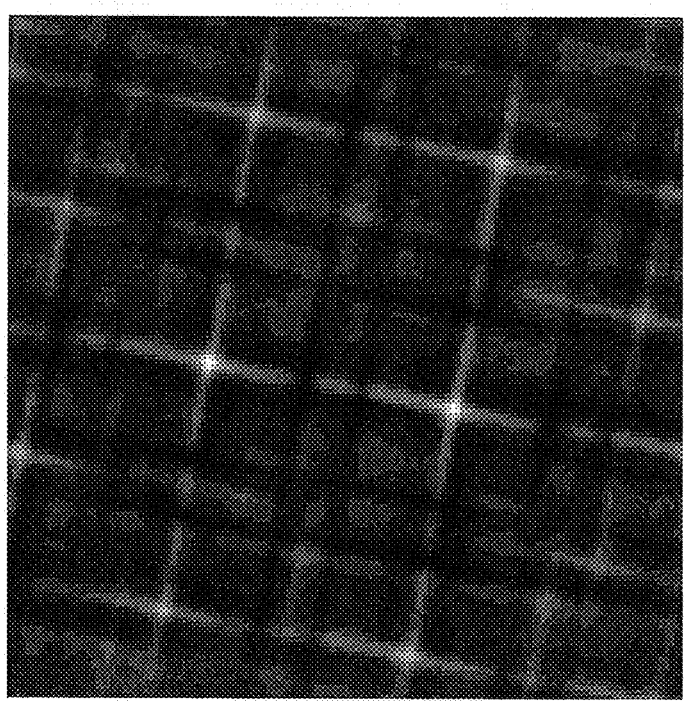
FIG. 9 is a diagram showing a cross-correlation function between the reference image shown in FIG. 7 and the compared image shown in FIG. 8.

FIG. 7 shows a reference image having a periodic structure flow periodicity. FIG. 8 shows a compared image obtained by laterally shifting the reference image shown in FIG. 7 by a distance of 27 pixels. FIG. 9 shows a cross-correlation function between the reference image of FIG. 7 and the compared image of FIG. 8. FIG. 10 is a table listing local maximum positions of the cross-correlation function shown in FIG. 9, the local maximum positions being arranged in decreasing order.

As shown in FIG. 10, the cross-correlation function shown in FIG. 9 has a plurality of local maximum values. However, there is a difference of about 20% between the highest local maximum value (at order 1) and the next highest local maximum value (at order 2).

Therefore, if it is assumed that the value of the coefficient α is approximately 1.1 (α=1.1), both the cross-correlation functions shown in FIGS. 4 and 9 permit selection of local maximum positions corresponding to an amount of drift. In this way, the coefficient α that makes it possible to select a local maximum value corresponding to an amount of drift can be determined irrespective of whether there is a periodic structure by determining the coefficient α from a list of local maximum values of a cross-correlation function between images having periodic structures and from a list of local maximum values of a cross-correlation function between images having no periodic structure.

Accordingly, the drift amount computing device 100 can calculate an amount of drift for an image containing no periodic structure as described previously, in the same way as for an image containing a periodic structure. Hence, an amount of drift can be found easily irrespective of whether there is periodicity.

In the drift amount computing device 100, the drift correction amount computing section 119 calculates an amount of drift correction between a reference image and a compared image, based on the amount of drift computed by the drift amount computing section 118 and so a drift correction can be made easily.

The charged particle beam system 1000 contains the drift amount computing device 100 capable of correcting an amount of drift correctly and, therefore, drifts can be corrected precisely.

2. Method of Computing Amount of Drift

Figure 11:
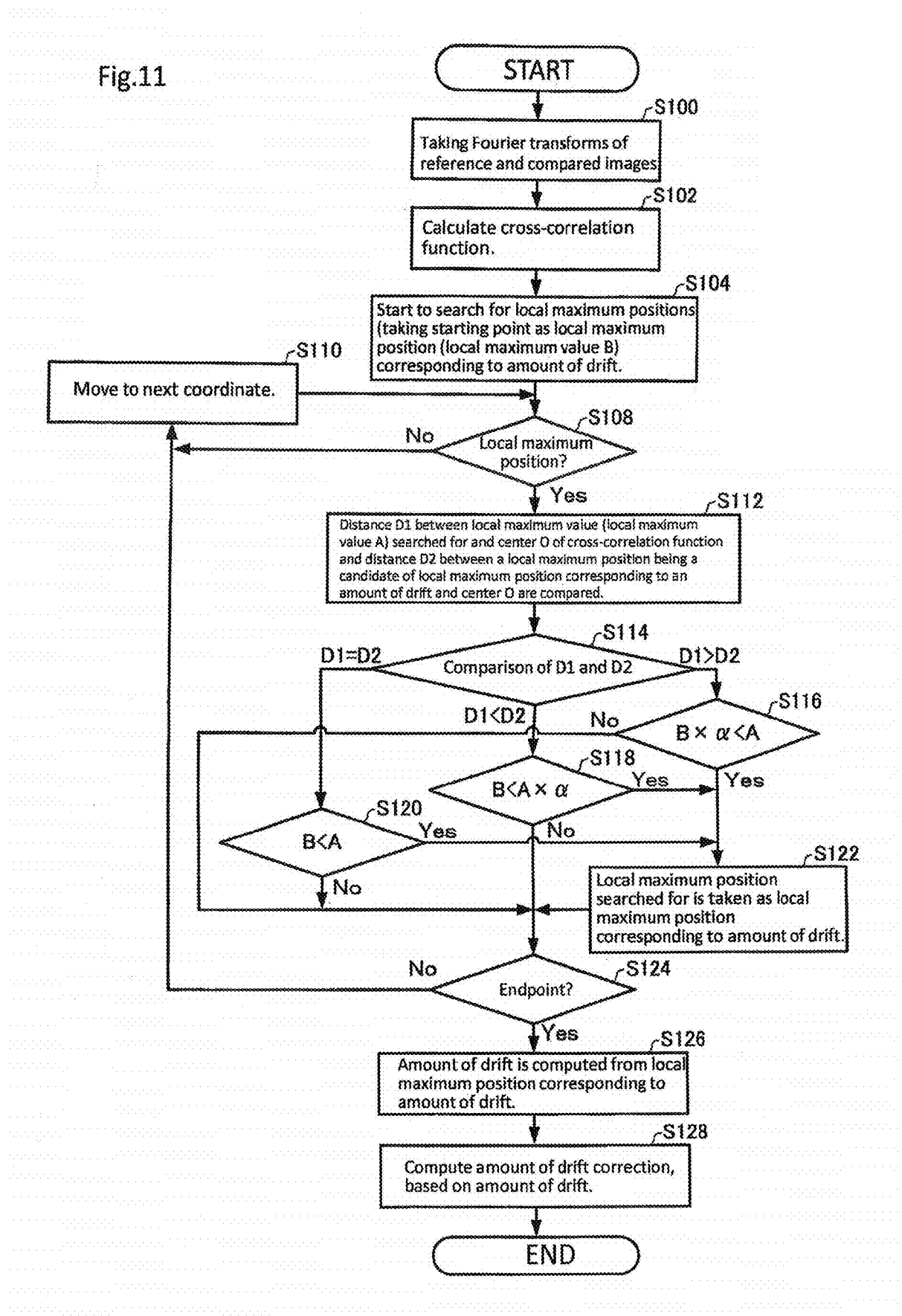
FIG. 11 is a flowchart illustrating one example of method of computing an amount of drift in accordance with another embodiment of the present invention.

A method of computing an amount of drift by the use of the drift amount computing device 100 associated with the present embodiment is next described by referring to FIG. 11, which is a flowchart illustrating one example of the method of computing an amount of drift in accordance with the present embodiment.

If a user asks for an operation for calculating an amount of drift via the manual control portion 120, the processing unit 110 accepts a manual control signal from the manual control portion 120 and starts a processing subroutine.

First, the correlation function computing section 112 Fourier transforms the reference image and the compared image (step S100). Then, the correlation function computing section 112 calculates a cross-correlation function from the Fourier transformed reference image and compared image (step S102).

Then, the local maximum position searching section 114 starts to search a range of positions of the cross-correlation function for local maximum positions at which the cross-correlation function found by the correlation function computing section 112 assumes its local maxima (step S104). The local maximum position searching section 114 starts to search the range of positions of the cross-correlation function shown in FIG. 4, for example, from the left top end. At this time, the local maximum position determining section 116 takes the starting point of the search as a candidate of local maximum position corresponding to an amount of drift and stores the position and intensity (local maximum value) B of the starting point in the storage device 124.

The local maximum position searching section 114 starts to make a search from the starting point of search of the positions of the cross-correlation function and makes a decision as to whether each coordinate is a local maximum position where there is a local maximum (step S108). If the decision at step S108 is negative (No), indicating that it is not a local maximum position, then the local maximum position searching section 114 shifts to the next coordinate (step S110) and makes a decision as to whether this coordinate is a local maximum position (step S108).

If the decision at step S108 is affirmative (Yes), indicating that the local maximum position searching section 114 has determined that the coordinate is a local maximum position, then the local maximum position determining section 116 compares the distance D1 between the local maximum value (local maximum value A) searched for and the center O of the cross-correlation function and the distance D2 between a local maximum position being a candidate of local maximum position corresponding to an amount of drift and the center O (step S112). The determining section 116 compares the distances D1 and D2 using information about the local maximum position searched for by the local maximum position searching section 114 and information about the candidate of the local maximum position stored in the storage device 124.

If the distance D1 is greater than the distance D2 (in a case where the decision at step S114 is that D1>D2), the local maximum position determining section 116 takes the local maximum position searched for as a candidate of local maximum position corresponding to an amount of drift provided that the relationship B×α<A holds (in a case where the decision at step S116 is Yes) (step S122). The local maximum position determining section 116 updates the information about the candidate of local maximum position stored in the storage device 124.

If the step S122 where one local maximum position searched for is taken as a local maximum position corresponding to an amount of drift by the local maximum position determining section 116 ends, or if the relationship, B×α<A, does not hold (the decision at step S116 is No), then the local maximum position searching section 114 makes a decision as to whether the position is an endpoint, i.e., whether the search of all the positions of the cross-correlation function is complete (step S124).

If the decision at step S114 is that D1<D2, indicating that the distance D1 is smaller than the distance D2, then the local maximum determining section 116 takes the local maximum position searched for as a local maximum position (a candidate of local maximum position) corresponding to the amount of drift provided that the relationship, B<A×α, is satisfied (the decision at step S118 is Yes) (step S122). The local maximum determining section 116 updates the information about the candidate of local maximum position stored in the storage device 124.

If the step S122 where one local maximum position searched for is taken as a local maximum position corresponding to the amount of drift by the local maximum position determining section 116 ends, or if the relationship, B<A×α, is not satisfied (the decision at step S118 is No), then the local maximum position searching section 114 makes a decision as to whether the position is an endpoint (step S124).

If the decision at step S114 is that D1=D2, indicating that the distances D1 and D2 are equal and, at the same time, the decision at step S120 is affirmative (Yes), indicating that the relationship, B<A, holds, then the local maximum position determining section 116 takes the local maximum position searched for as a candidate of local maximum position corresponding to an amount of drift (step S122). The local maximum position determining section 116 updates the information about the candidate of local maximum position stored in the storage device 124.

If the step S122 where the local maximum position determining section 116 takes the local maximum position searched for as a local maximum position corresponding to the amount of drift ends or if the relationship, B<A, is not satisfied (i.e., the decision at step S120 is negative (No)), then the local maximum position searching section 114 makes a decision as to whether the position is an endpoint (step S124).

If the decision at step S124 is negative (No), indicating that the position is not an endpoint, then the local maximum position searching section 114 moves to the next coordinate (step S110) and makes a decision as to whether or not this coordinate is a maximum local position (step S108).

The local maximum position searching section 114 and the local maximum position determining section 116 repeat the above-described processing of steps S108-S124. If the decision at step S124 is affirmative (Yes), indicating that the local maximum position searching section 114 has determined that the position searched for is an endpoint, then the local maximum position determining section 116 determines the candidate of local maximum position corresponding to the amount of drift and finally remaining in the storage device 124 as a local maximum position corresponding to the amount of drift.

The drift amount computing section 118 computes an amount of drift between the reference image and the compared image, based on the local maximum position corresponding to the amount of drift and determined by the local maximum position determining section 116 (step S126).

The drift correction amount computing section 119 then calculates an amount of drift correction by which to correct the drift between the first and second images, based on the amount of drift calculated by the drift amount computing section 118 (step S128). The processing unit 110 outputs information about the amount of drift correction to the scanner 13 and ends the present processing subroutine.

The method of computing an amount of drift in accordance with the present embodiment has the following features. This method comprises the steps of: searching a range of positions of a correlation function between a reference image and a compared image for local maximum positions at which the correlation function assumes its local maxima; assigning weights to the intensities of the local maximum positions searched for according to the distance from the center of the correlation function, comparing the weighted intensities, and determining a local maximum position corresponding to the amount of drift; and computing the amount of drift based on the local maximum position corresponding to the amount of drift. Therefore, in the method associated with the present embodiment to compute an amount of drift, the possibility that the amount of drift will be overcalculated can be reduced for an image which contains a periodic structure and which suffers from image blurring or is affected by noises. Consequently, the method associated with the present embodiment can be used to compute an amount of drift precisely even for an image containing a periodic structure.

Furthermore, the method associated with the present embodiment can be used to compute an amount of drift for an image containing no periodic structure, as well as for an image containing a periodic structure. In consequence, an amount of drift can be found easily irrespective of whether there is periodicity.

In the method associated with the present embodiment to compute an amount of drift, let A be the intensity of a first one of two local maximum positions searched for. Let B be the intensity of a second one of the local maximum positions. During the step of determining a local maximum position, if the distance between the first local maximum position and the center O of a correlation function is greater than the distance between the second local maximum position and the center O of the correlation function and, at the same time, the relationship, $B \times \alpha < A$ (where $\beta > 1$), is satisfied, the first local maximum position is taken as a candidate of local maximum position corresponding to the amount of drift. If the distance between the first local maximum position and the center O of the correlation function is smaller than the distance between the second local maximum position and the center O of the correlation function and, at the same time, the relationship, $B < A \times \alpha$, is satisfied, then the first local maximum position is taken as a candidate of local maximum position corresponding to the amount of drift. Therefore, in the method associated with the present embodiment to compute an amount of drift, weights can be assigned to the intensities of the local maximum positions according to the distance from the center of the correlation function and the weighted intensities can be compared. Consequently, even for an image having a periodic structure, the possibility that the amount of drift will be overcalculated can be reduced. Furthermore, for an image having no periodic structure, an amount of drift can be computed in the same way as for an image containing a periodic structure.

The method associated with the present embodiment to compute an amount of drift involves the step of calculating an amount of drift correction between a reference image and a compared image, based on a computed amount of drift. Therefore, a drift correction can be made easily.

3. Modifications

3.1. First Modification

A drift amount computing device associated with a first modification of the present embodiment is next described. This device is similar in configuration to the drift amount computing device 100 already described in connection with FIG. 1 and a description thereof is omitted. Only the differences with the drift amount computing device 100 are described below.

In the above description of the drift amount computing device 100, the local maximum position searching section 114 searches a range of positions of the cross-correlation function shown in FIG. 4 for local maximum values in turn from the left top end to the right bottom end.

In contrast, in the present modification, the local maximum position searching section 114 starts a search from the center of the cross-correlation function. The searching section 114 searches for local maximum positions in turn first from a position least distant from the center. The local maximum position determining section 116 assigns weights to the intensities of the local maximum positions searched for in turn by the local maximum position searching section 114 according to the distance from the center of the cross-correlation function and compare the weighted intensities.

The drift amount computing device associated with the present modification can yield advantageous effects similar to those produced by the aforementioned drift amount computing device 100. Furthermore, in the present modification, information about each local maximum position is entered into the local maximum position determining section 116 in turn first from a local maximum position least distant from the center of the cross-correlation function. Therefore, it is easy to compare local maximum positions in terms of the distance from the center of the cross-correlation function. Consequently, the process can be simplified. A method associated with the present modification to compute an amount of drift is similar to the drift amount computing method already described in connection with FIG. 11 and so a description thereof is omitted.

3.2. Second Modification

A drift amount computing device associated with a second modification of the present embodiment is next described. This device is similar in configuration to the drift amount computing device 100 already described in connection with FIG. 1 and a description thereof is omitted. Only the differences of the device associated with this second modification with the drift amount computing device 100 are described below.

In the above-described drift amount computing device 100, one of two local maximum positions which is less distant from the center of the cross-correlation function is multiplied by coefficient $\alpha$ to thereby assign weights to the intensities of the local maximum positions according to the distance from the center of the cross-correlation function.

In contrast, in the present modification, the local maximum position determining section 116 multiplies a cross-correlation function by a window function to assign weights to local maximum positions according to the distance from the center of the cross-correlation function.

In particular, the local maximum position determining section 116 multiplies a cross-correlation function by a window function (such as a sine function) whose value decreases with increasing distance from the center of the cross-correlation function and becomes null at the outermost positions. That is, the local maximum position determining section 116 multiplies a cross-correlation function by a window function that assigns weights to the vicinities of the center of the cross-correlation function. Consequently, weights can be assigned to the intensities (local maximum values) of the cross-correlation function according to the distance from the center of the cross-correlation function. The present modification can yield advantageous effects similar to those of the above-described drift amount computing device 100.

Figure 12:
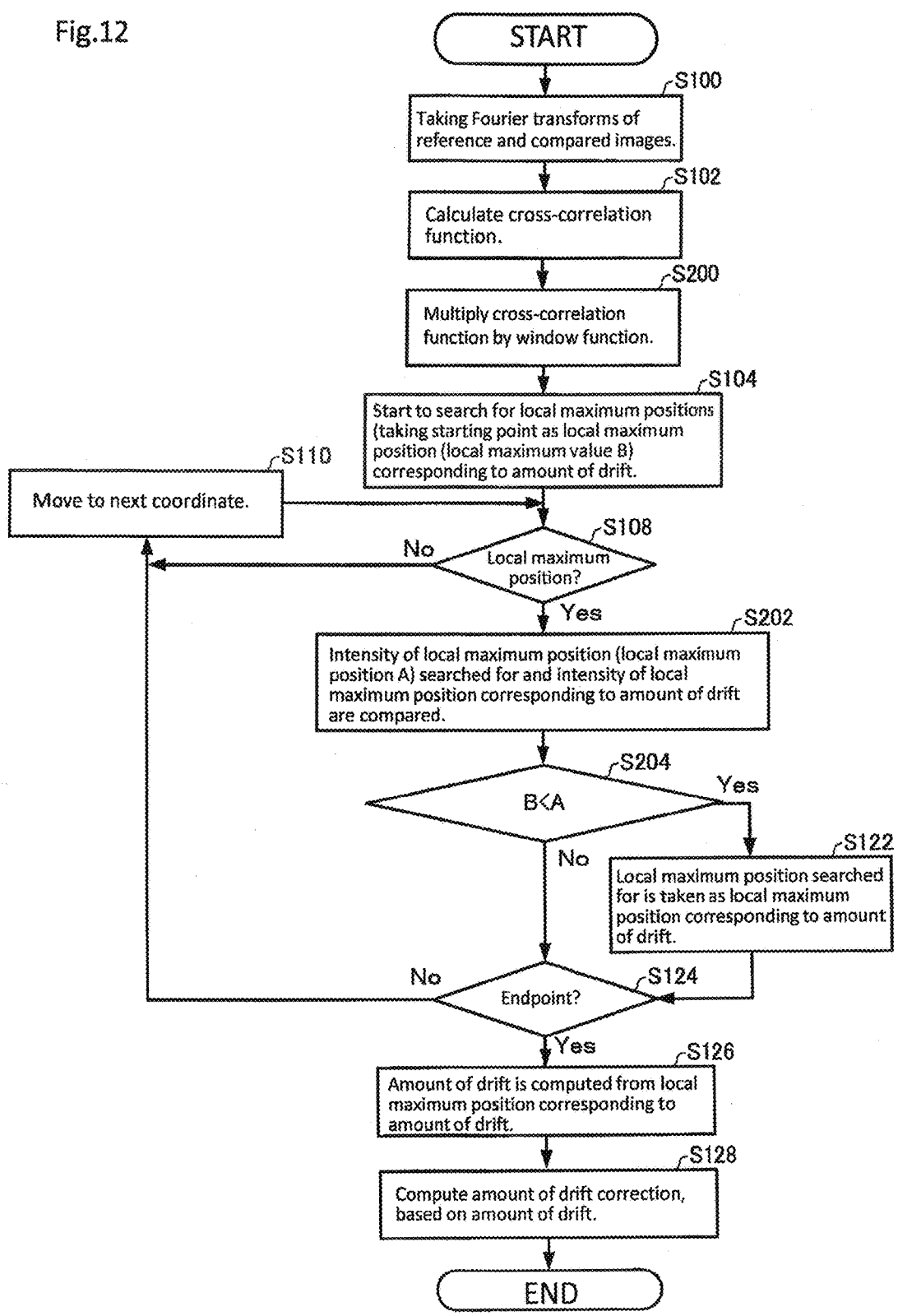
FIG. 12 is a flowchart illustrating one example of method of computing an amount of drift in accordance with a second modification.
Figure 13:
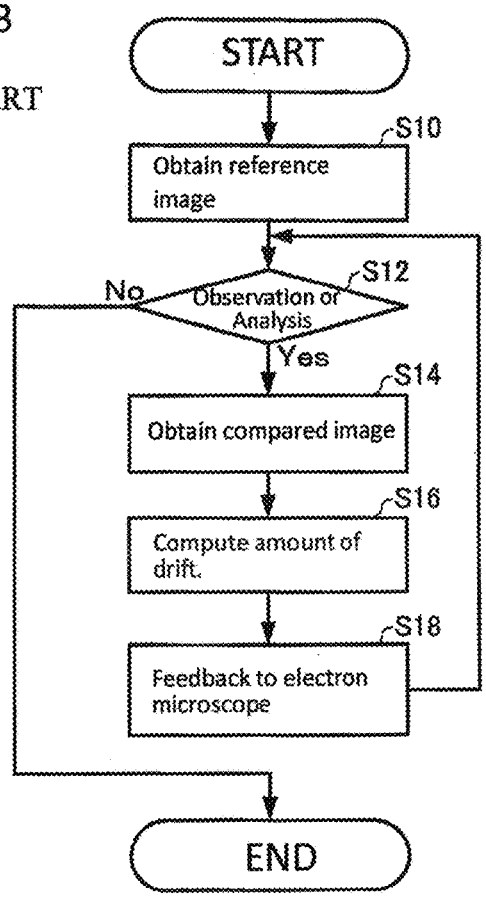
FIG. 13 is a flowchart illustrating one example of a general operation for making a drift correction.
Figure 14:
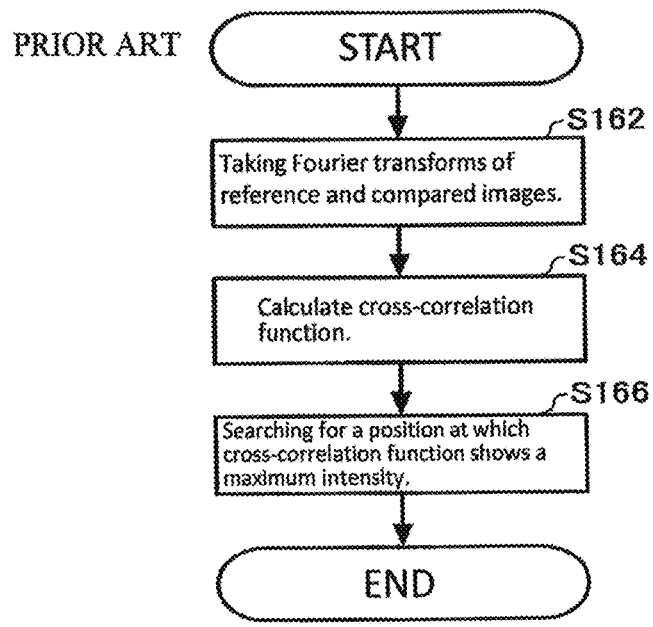
FIG. 14 is a flowchart illustrating one example of a general operation for computing an amount of drift.
Figure 15:
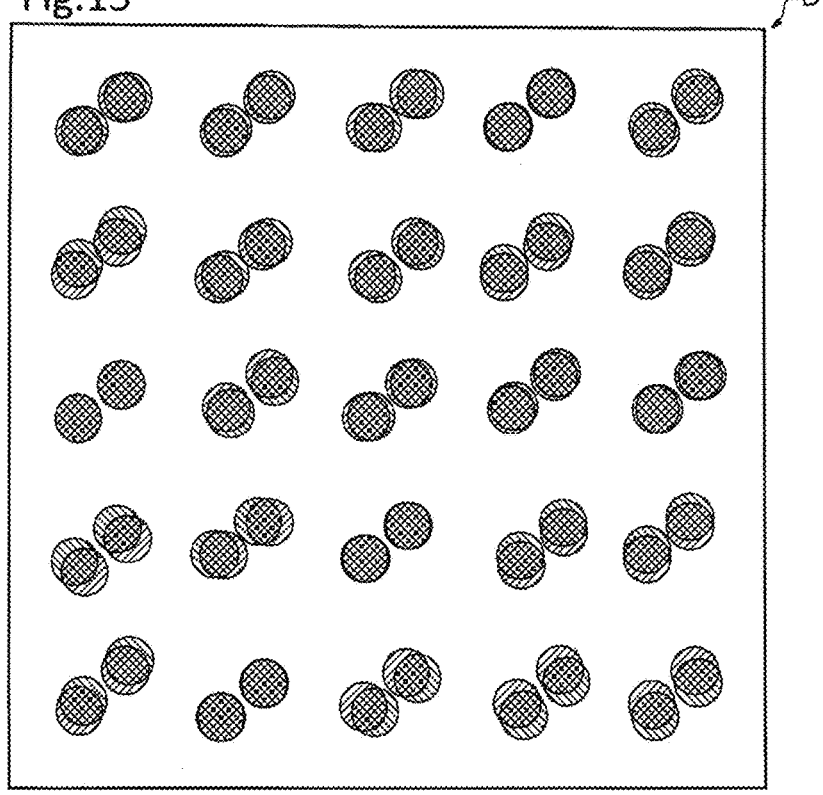
FIG. 15 is a schematic representation of an image in which a reference image containing a periodic structure and a compared image containing a periodic structure are superimposed.
Figure 16:
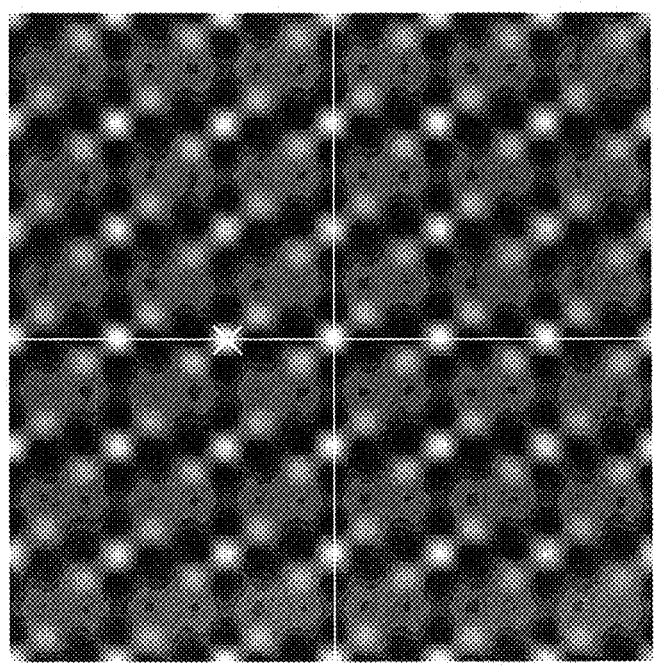
FIG. 16 is a diagram illustrating one example of a cross-correlation function between a reference image and a compared image both of which suffer from image blurring.

A method of computing an amount of drift by the use of the drift amount computing device associated with the second modification is next described by referring to FIG. 12, which is a flowchart illustrating one example of this method. Those steps of the flowchart of FIG. 12 which are similar to their respective counterparts of the flowchart of FIG. 11 are indicated by the same reference numerals as in FIG. 11 and a detailed description thereof is omitted.

For example, if a user asks for a computation of an amount of drift via the manual control portion 120, the processing unit 110 accepts a manual control signal from the manual control portion 120 and starts a processing subroutine.

First, the correlation function computing section 112 Fourier transforms a reference image and a compared image (step S100). The correlation function computing section 112 then calculates a cross-correlation function from the Fourier transformed reference image and compared image (step S102). Then, the local maximum position determining section 116 multiplies the cross-correlation function found by the correlation function computing section 112 by a window function to assign weights according to the distance from the center of the cross-correlation function (step S200). The local maximum position searching section 114 then starts to search a range of positions of the cross-correlation function for local maximum positions (where local maxima occur) of the cross-correlation function to which the window function has been applied (step S104). The local maximum position determining section 116 takes the position of the starting point of the search as a candidate of local maximum position corresponding to an amount of drift and stores the position and intensity (local maximum value) B in the storage device 124. The local maximum position searching section 114 starts the search from the starting point of the search for the cross-correlation function to which the window function has been applied, and makes a decision as to whether each coordinate is a position where a local maximum occurs (i.e., whether each position is a local maximum position) (step S108). If the decision at step S108 is No, indicating that the position is not a local maximum position, then the local maximum position searching section 114 moves to the next coordinate (step S110) and makes a decision as to whether this coordinate is a local maximum position (step S108).

If the decision at step S108 is affirmative (Yes), indicating that the local maximum position searching section 114 has determined that the coordinate is a local maximum position, then the local maximum position determining section 116 compares the intensity (local maximum value) A of the local maximum position searched for and the intensity (local maximum value) B of the local maximum position set to be a local maximum position corresponding to an amount of drift (step S202).

If the decision at step S204 is affirmative, (Yes), indicating that the local maximum value A is greater than the local maximum value B, then the local maximum position determining section 116 takes the local maximum position searched for as a candidate of local maximum position corresponding to an amount of drift (step S122). The local maximum position determining section 116 updates the information about candidates of local maximum positions corresponding to an amount of drift stored in the storage device 124.

If the step S122 in which the local maximum position searched for is taken as a local maximum position corresponding to an amount of drift by the local maximum position determining section 116 ends or if the decision at step S204 is negative (No), indicating that the local maximum value A is not greater than the local maximum value B, then the local maximum position searching section 114 makes a decision as to whether the position is an endpoint, i.e., whether the search of all the positions of the cross-correlation function is completed (step S124).

If the decision at step S124 is negative (No), indicating that the position is not an endpoint, then the local maximum position searching section 114 moves to the next coordinate (step S110) and makes a decision as to whether this coordinate is a local maximum position (step S108).

The local maximum position searching section 114 and the local maximum position determining section 116 repeat the above-described processing of steps S108, S202, S204, S122, S124, and S110. If the decision at step S124 is Yes, indicating that the position searched for by the local maximum position searching section 114 is an endpoint, then the local maximum position determining section 116 determines a candidate of local maximum position corresponding to the amount of drift and finally remaining in the storage device 124 as a local maximum position corresponding to the amount of drift.

The drift amount computing section 118 computes an amount of drift between the reference image and the compared image, based on the local maximum position corresponding to the amount of drift determined by the local maximum position determining section 116 (step S126).

The drift correction amount computing section 119 then calculates an amount of drift correction by which to correct the drift between the first and second images, based on the amount of drift computed by the drift amount computing section 118 (step S128). The processing unit 110 outputs information about the amount of drift correction to the scanner 13 and ends the processing subroutine.

The drift amount computing method associated with the present modification can yield the same advantageous effects as the above-described drift amount computing method associated with the present embodiment.

It is to be understood that the present invention is not restricted to the above-described embodiments but rather various changes and modifications are possible without departing from the gist of the present invention.

For example, in the description of the above embodiments and modifications, the charged particle beam system is a scanning transmission electron microscope (STEM). No restrictions are imposed on the charged particle beam system associated with the present invention as long as the system irradiates a sample with a beam of charged particles such as electrons or ions and produces an image. That is, the charged particle beam system associated with the present invention can be a scanning electron microscope (SEM), a transmission electron microscope (TEM), a focused ion beam (FIB) system, or other instrument. The drift amount computing device associated with the present invention is incorporated in such a charged particle beam system and can compute an amount of drift between images obtained by the charged particle beam system.

Furthermore, in the description of the above embodiments and modifications, the drift amount computing device 100 is incorporated in the charged particle beam system 1000. The drift amount computing device associated with the present invention may not be included in a charged particle beam system. For instance, the drift amount computing device associated with the present invention may operate to obtain a reference image and a compared image for which an amount of drift should be computed, for example, via the data storage medium 126 and to compute the amount of drift.

The charged particle beam system associated with the present invention may have a mode of operation in which an amount of drift is computed by the method associated with the present invention to compute a drift amount and a mode of operation in which an amount of drift is computed by a conventional drift amount computing method different from the inventive method. For example, the charged particle beam system associated with the present invention may be equipped with a user interface permitting a user to select a mode of operation via the manual control portion.

It is to be understood that the above-described embodiments and modifications are merely exemplary and that the present invention is not restricted thereto. For example, the embodiments and modifications may be appropriately combined.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity required by the Patent Laws, what is desired protected by Letters Patent is set forth in the following claims.

The invention claimed is:

1. A drift amount computing device comprised of hardware executing software programs and, optionally, at least in part by dedicated circuitry for computing an amount of drift between a first image and a second image, said drift amount computing device comprising:
a correlation function computing section for calculating a correlation function between the first and second images;
a local maximum position searching section for searching a range of positions of the correlation function for local maximum positions at which the correlation function assumes its local maxima;
a local maximum position determining section for assigning weights to intensities of the local maximum positions searched for by the local maximum position searching section according to the distance from the center of the correlation function, comparing the weighted intensities, and determining one of the local maximum positions which corresponds to the amount of drift; and
a drift amount computing section for computing the amount of drift, based on the local maximum position corresponding to the amount of drift,
wherein said plural local maximum positions searched for by said local maximum position searching section are two in number and include a first local maximum position and a second local maximum position which have intensities A and B, respectively, and
wherein said local maximum position determining section takes the first local maximum position as a candidate which is selected from the local maximum positions and which corresponds to the amount of drift if the distance between the first local maximum position and the center is greater than the distance between the second local maximum position and the center and, at the same time, a relationship given by $B \times \alpha < A$ (where $\alpha > 1$) is satisfied, and takes the first local maximum position as a candidate which is selected from the local maximum positions and which corresponds to the amount of drift if the distance between the first local maximum position and the center is smaller than the distance between the second local maximum position and the center and, at the same time, a relationship given by $B < A \times \alpha$ is satisfied.

2. The drift amount computing device as set forth in claim 1, wherein said correlation function is a cross-correlation function or a phase-only correlation function.

3. The drift amount computing device as set forth in claim 1, wherein said local maximum position searching section searches for the local maximum positions in turn first from the position least distant from said center of the correlation function, and wherein said local maximum position determining section assigns weights to the intensities of the local maximum positions in turn in the order in which the local maximum positions were searched for by the local maximum position searching section according to the distance from said center and compares the weighted intensities.

4. The drift amount computing device as set forth in claim 1, further comprising a drift correction amount computing section for calculating an amount of drift correction by which to correct the drift between the first and second images, based on the amount of drift.

5. A method of computing an amount of drift between a first image and a second image, comprising the steps of:
calculating a correlation function between the first and second images;
searching a range of positions of the correlation function for local maximum positions at which the correlation function assumes its local maxima;
assigning weights to intensities of the local maximum positions searched for by the step of searching a range of positions according to the distance from the center of the correlation function, comparing the weighted intensities of the local maximum positions, and determining one of the local maximum positions which corresponds to the amount of drift; and
computing the amount of drift, based on the local maximum position corresponding to the amount of drift,
wherein said plural local maximum positions searched for by the step of searching a range of positions are two in number and include a first local maximum position and a second local maximum position which have intensities A and B, respectively, and
wherein during the step of determining a local maximum position, if the distance between the first local maximum position and the center is greater than the distance between the second local maximum position and the center and, at the same time, a relationship given by $B \times \alpha < A$ (where $\alpha < 1$) is satisfied, then the first local maximum position is taken as a candidate which is selected from the local maximum positions and which corresponds to the amount of drift and if the distance between the first local maximum position and the center is smaller than the distance between the second local maximum position and the center and, at the same time, a relationship given by $B < A \times \alpha$ is satisfied, then the first local maximum position is taken as a candidate which is selected from the local maximum positions and which corresponds to the amount of drift.

6. The method of computing an amount of drift as set forth in claim 5, wherein said correlation function is a cross-correlation function or a phase-only correlation function.

7. The method of computing an amount of drift as set forth in claim 5, wherein during the step of searching a range of positions, the local maximum positions are searched for in turn first from the position least distant from the center of the correlation function, and wherein during the step of determining a local maximum position, weights are assigned in turn to the intensities of the local maximum positions according to the distance from said center in the order in which the local maximum positions were searched for during the step of searching a range of positions and the weighted intensities of the local maximum positions are compared.

8. The method of computing an amount of drift as set forth in claim 5, further comprising the step of calculating an amount of drift correction by which to correct the drift between the first and second images, based on said amount of drift.

9. A charged particle beam system including a drift amount computing device as set forth in claim 1.

* * * * *